(12) United States Patent
Wang et al.

(10) Patent No.: US 7,358,149 B2
(45) Date of Patent: Apr. 15, 2008

(54) SUBSTRATE ISOLATION IN INTEGRATED CIRCUITS

(75) Inventors: Daniel Wang, San Jose, CA (US); Chunchieh Huang, Fremont, CA (US); Dong Jun Kim, San Jose, CA (US)

(73) Assignee: ProMOS Technologies, Inc., Hsin-Chu (TW)

( * ) Notice: Subject to any disclaimer, the term of this patent is extended or adjusted under 35 U.S.C. 154(b) by 371 days.

(21) Appl. No.: 11/193,150

(22) Filed: Jul. 29, 2005

(65) Prior Publication Data

US 2005/0266628 A1 Dec. 1, 2005

Related U.S. Application Data

(62) Division of application No. 10/732,616, filed on Dec. 9, 2003.

(51) Int. Cl.
 *H01L 21/425* (2006.01)
(52) U.S. Cl. ............... 438/433; 438/525; 257/E21.551
(58) Field of Classification Search ................. 438/433
 See application file for complete search history.

(56) References Cited

U.S. PATENT DOCUMENTS

| | | | |
|---|---|---|---|
| 4,580,331 A | 4/1986 | Soclof | |
| 4,653,177 A | 3/1987 | Lebowitz et al. | |
| 5,013,673 A * | 5/1991 | Fuse | ........................... 438/389 |
| 5,448,090 A * | 9/1995 | Geissler et al. | ............. 257/305 |
| 5,960,276 A | 9/1999 | Liaw et al. | |
| 6,066,885 A * | 5/2000 | Fulford et al. | ............... 257/508 |
| 6,355,524 B1 | 3/2002 | Tuan et al. | |
| 6,537,888 B2 | 3/2003 | Lee | |
| 6,787,409 B2 | 9/2004 | Ji et al. | |
| 2003/0170964 A1 * | 9/2003 | Kao et al. | ..................... 438/433 |
| 2005/0012173 A1 * | 1/2005 | Sheu et al. | .................. 257/519 |

OTHER PUBLICATIONS

Jank, M.P.M.; Lemberger, M.; Ryssel, H. "Gate Oxide Damage Due To Through The Gate Implantation in MOS-Structures with Ultrathin and Standard Oxides" Ion Implantation Technology 2000 Conference; Meeting Date: Sep. 17-22, 2000; Alpbach, Austria, pp. 103-106.

(Continued)

*Primary Examiner*—Stephen W. Smoot
(74) *Attorney, Agent, or Firm*—Edward C. Kwok; MacPherson Kwok Chen & Heid LLP

(57) ABSTRACT

Substrate isolation trench (224) are formed in a semiconductor substrate (120). Dopant (e.g. boron) is implanted into the trench sidewalls by ion implantation to suppress the current leakage along the sidewalls. During the ion implantation, the transistor gate dielectric (520) faces the ion stream, but damage to the gate dielectric is annealed in subsequent thermal steps. In some embodiments, the dopant implantation is an angled implant. The implant is performed from the opposite sides of the wafer, and thus from the opposite sides of each active area. Each active area includes a region implanted from one side and a region implanted from the opposite side. The two regions overlap to facilitate threshold voltage adjustment.

23 Claims, 11 Drawing Sheets

OTHER PUBLICATIONS

Shibahara, K.; Fujimoto, Y.; Hamada M.; Iwao, S.; Tokashiki, K.; and Kunio, T. "Trench Isolation With (NABLA)—Shaped Buried Oxide for 256 Mega-Bit Drams" IEEE 1992, pp. 10.5.1-10.5.4.

Fuse, G.; Fukumoto, M.; Shinohara, A.; Odanaka, S.; Sasago, M.; Ohzone, T. "A New Isolation Method with Boron-Implanted Sidewalls for Controlling Narrow-Width Effect" IEEE Transactions on Electron Devices, vol. ED-34, No. 2, Feb. 1987, pp. 356-360.

Ohe, K.; Odanaka, S.; Moriyama, K.; Hori, T.; Fuse, G. "Narrow-Width Effects of Shallow Trench-Isolated CMOS with n+-Polysilicon Gate" IEEE Transactions on Electron Devices, vol. 36, No. 6, Jun. 1989, pp. 1110-1116.

Stanly Wolf, "Silicon Processing For the VSLI Era" vol. 1 Lattice Press, 1986, pp. 208, 395.

Stanly Wolf, "Silicon Processing For the VSLI Era" vol. 2 Lattice Press, 1990, pp. 570,619,633.

* cited by examiner

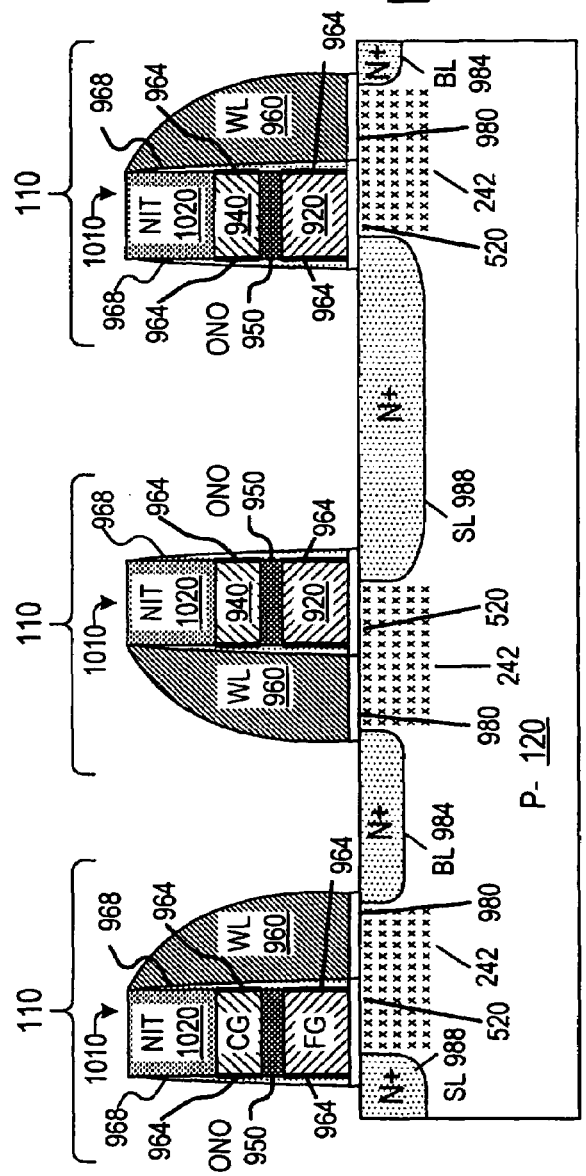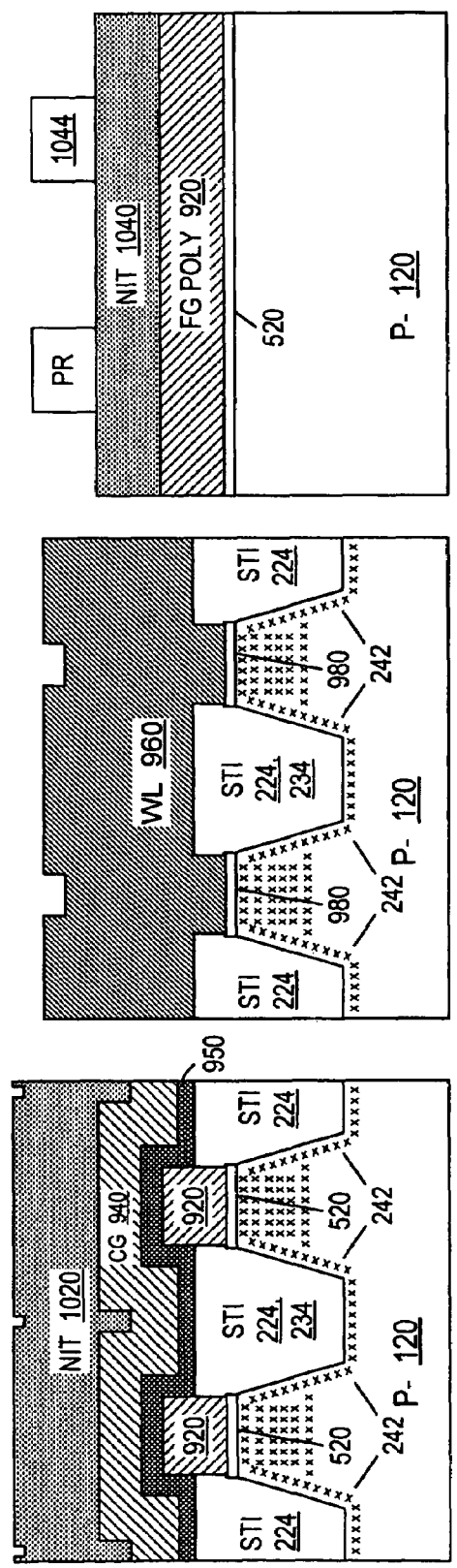

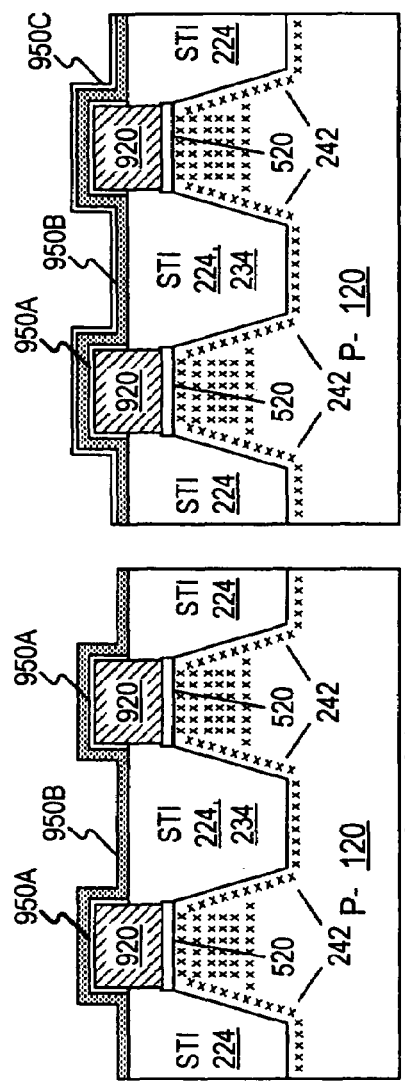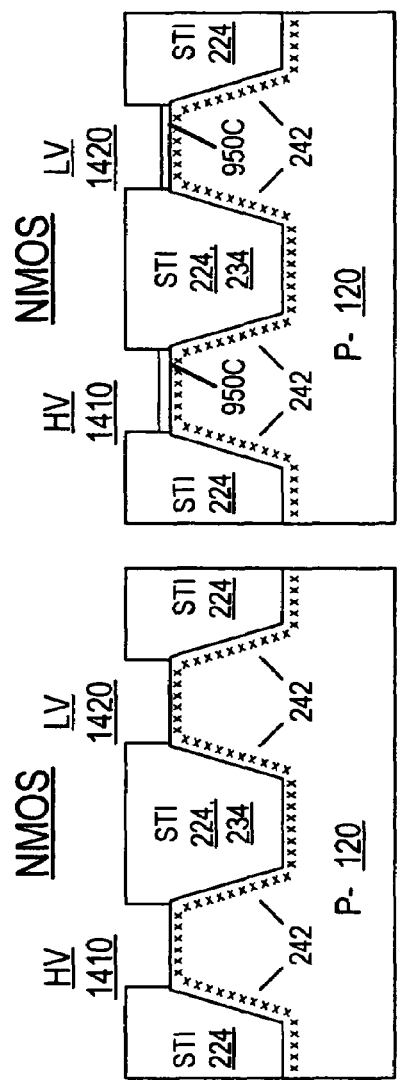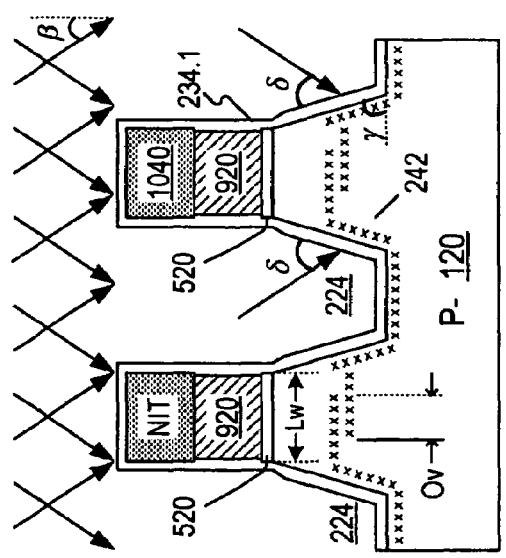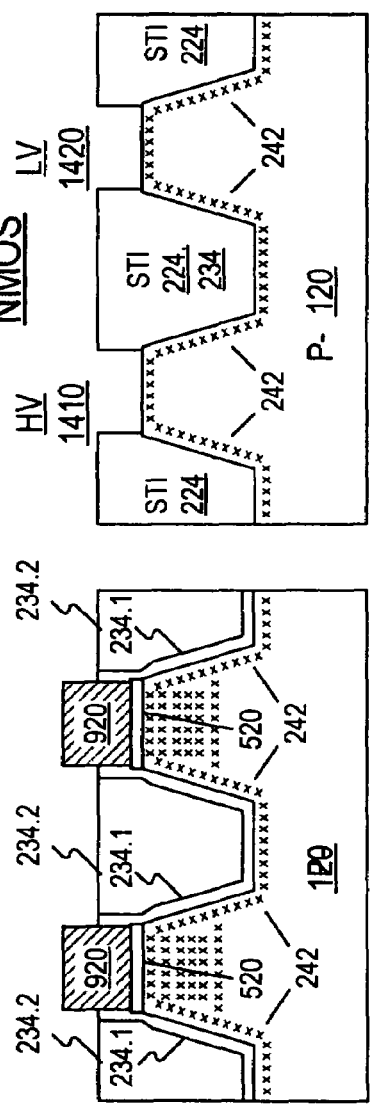

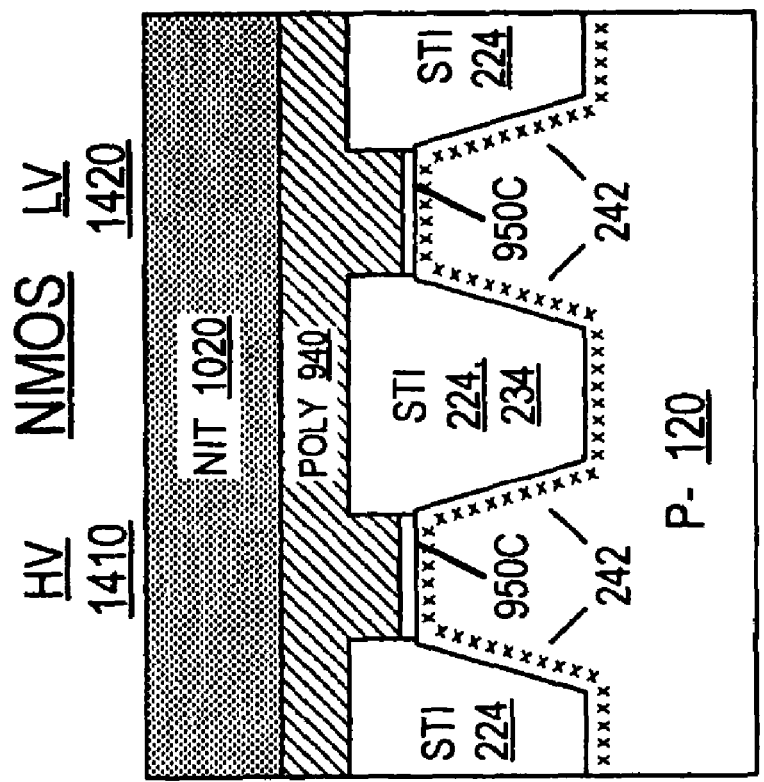

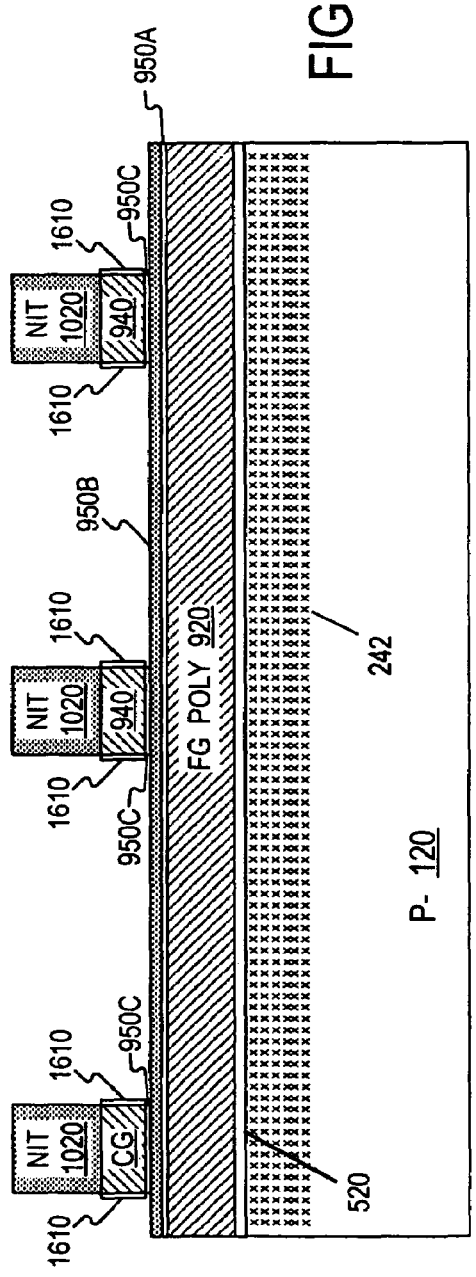
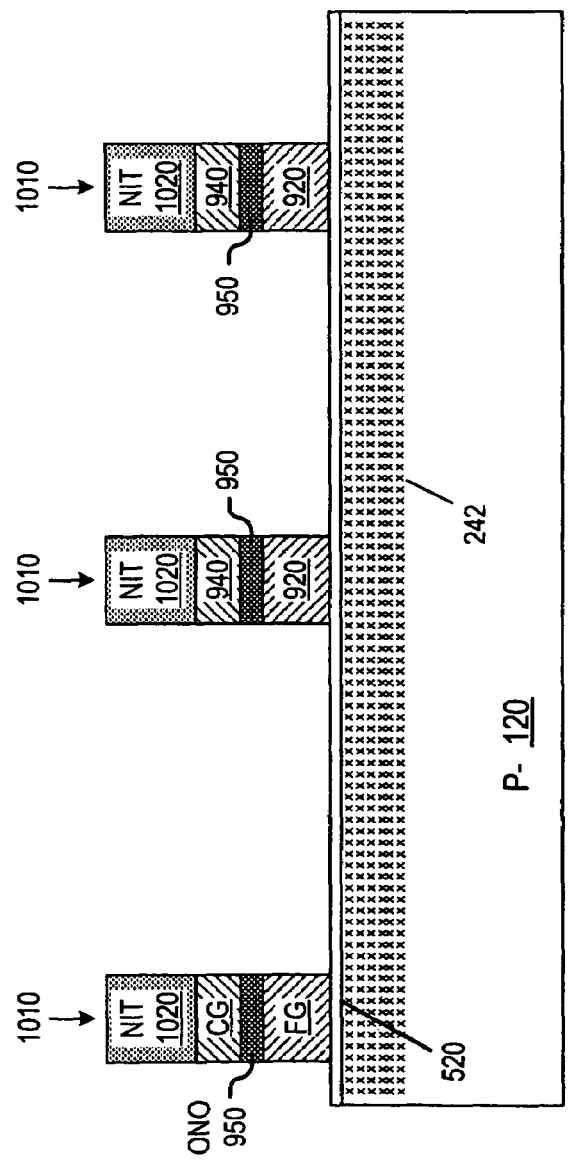
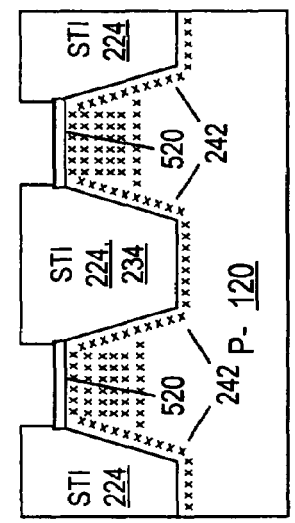
FIG. 16 (Y1-Y1')
FIG. 17A (Y1-Y1')
FIG. 17B (X2-X2')

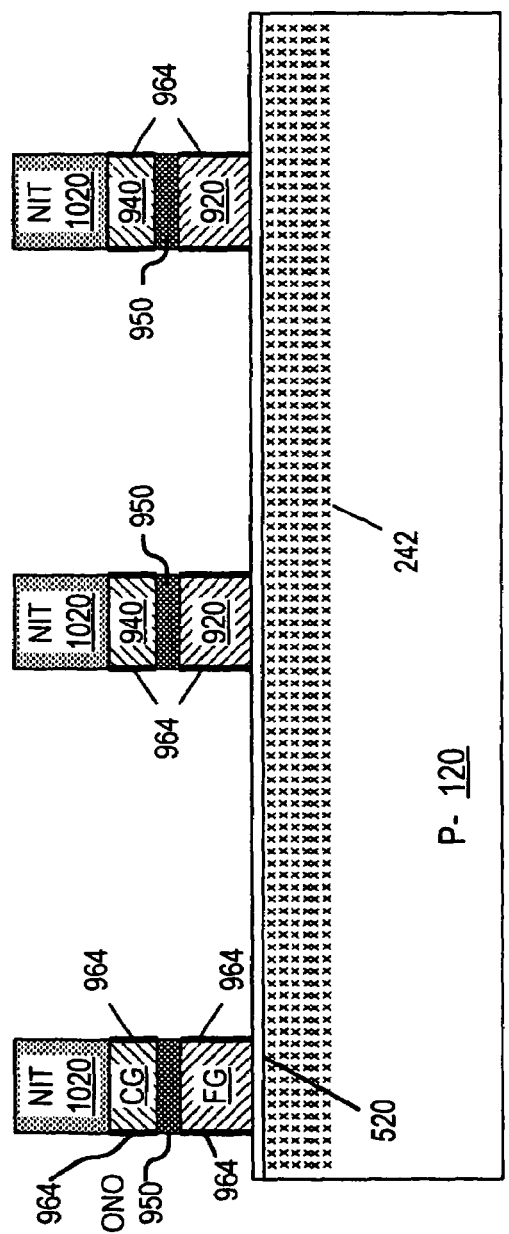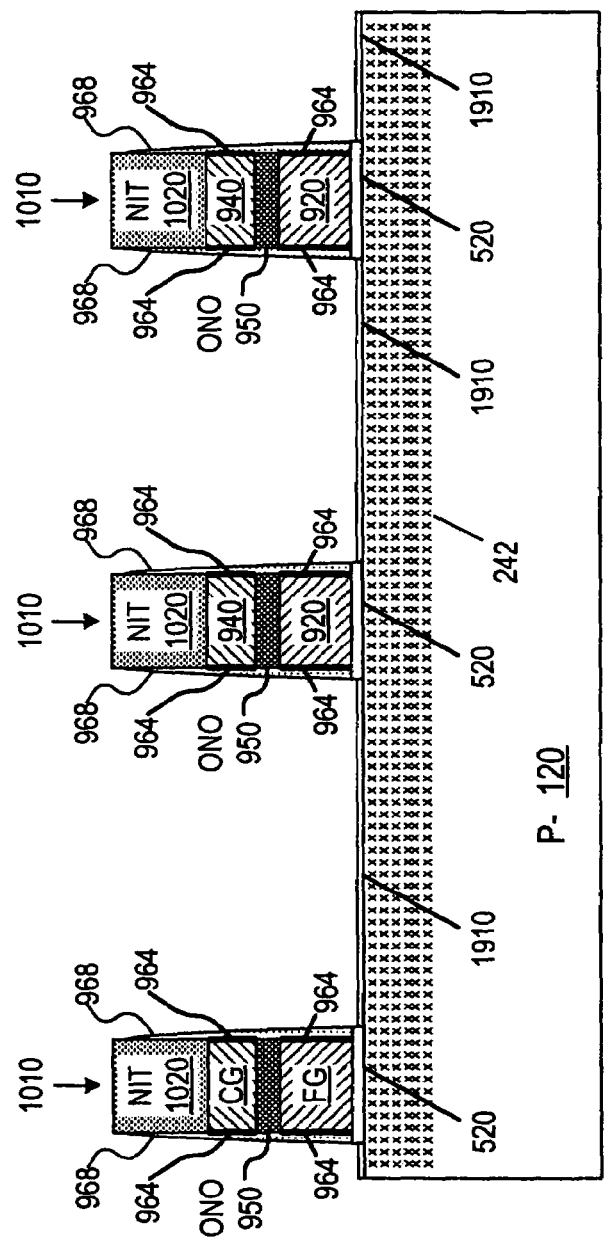

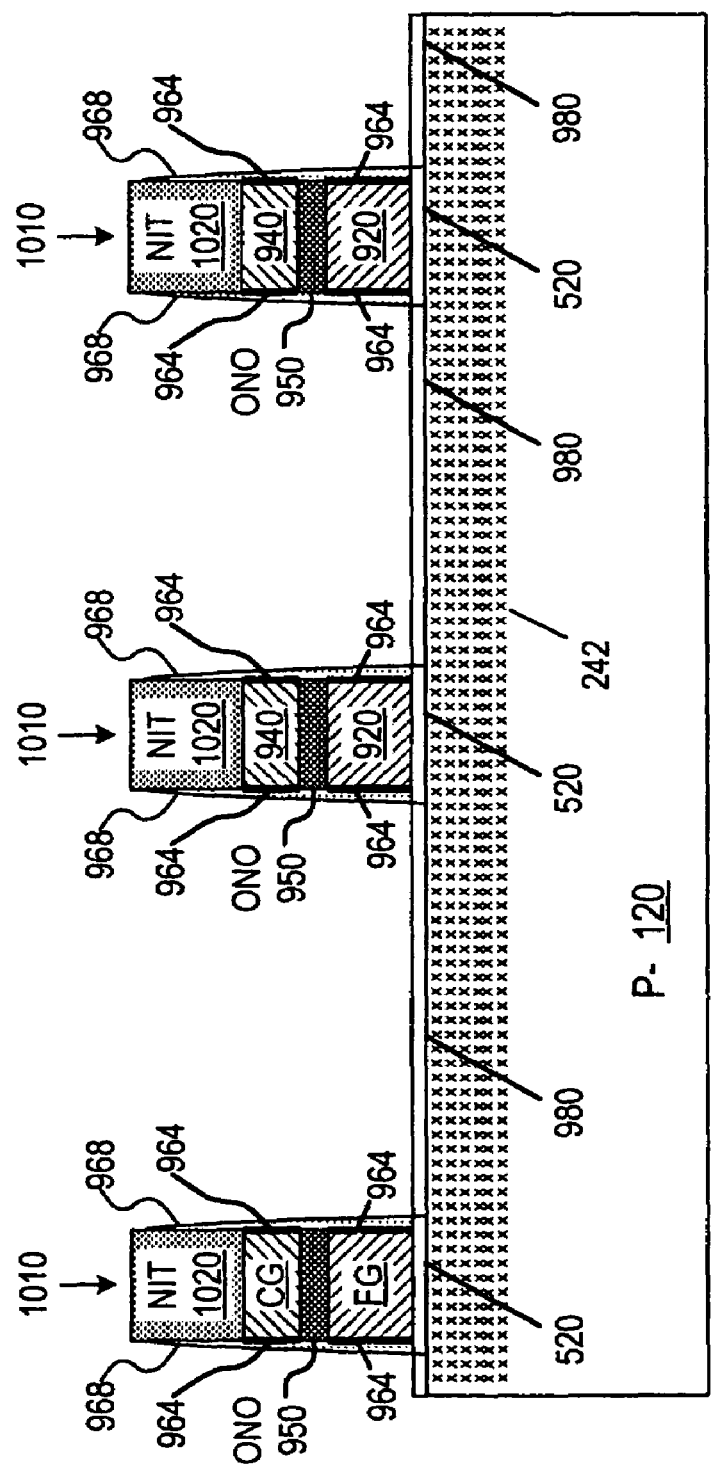
FIG. 20 (Y1-Y1')

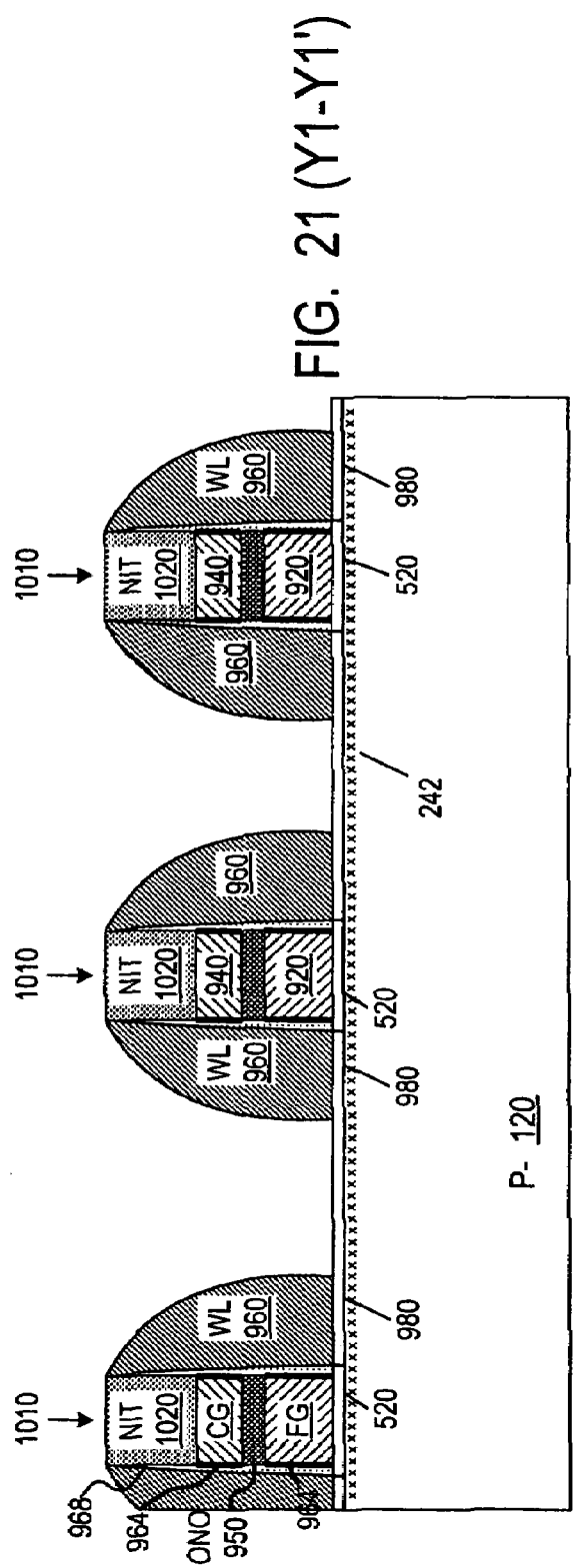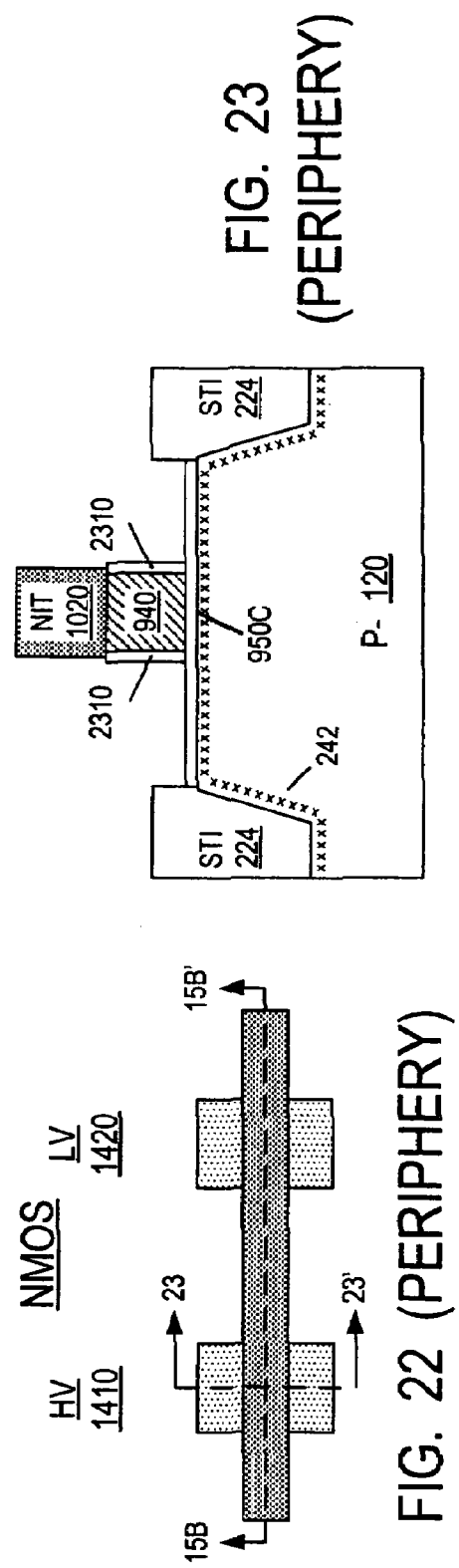

SUBSTRATE ISOLATION IN INTEGRATED CIRCUITS

CROSS REFERENCE TO RELATED APPLICATIONS

The present application is a division of U.S. patent application Ser. No. 10/732,616, filed Dec. 9, 2003, incorporated herein by reference.

BACKGROUND OF THE INVENTION

The present invention relates to integrated circuits, and more particularly to substrate isolation in the integrated circuits.

Substrate isolation regions provide isolation between active device areas of a semiconductor substrate. FIGS. 1-4 illustrate a shallow trench isolation process (STI) described in U.S. Pat. No. 5,960,276 issued Sep. 28, 1999 to Liaw et al., incorporated herein by reference. A pad oxide layer 102 and a silicon nitride barrier layer 106 are deposited over substrate 120 (FIG. 1). Trenches 224 (FIG. 2) are etched in substrate 120 to define active areas 230 (i.e. 230.1, 230.2, 230.3). An oxide liner 234.1 is thermally grown on the surface of trenches 224. The liner formation helps passivate the trench sidewalls, as explained in Wolf, "Silicon Processing for the VLSI Era", volume 3 ("Submicron Transistor"), 1995, page 368.

Then boron is implanted at an energy between about 15 and 45 KeV, a dose between about 3E12 and 5E13 ions/cm$^2$, and an angle α of 15° to 45° to the substrate surface. The boron implant helps mitigate the inverse narrow width effect. This effect is due to a current leakage path along the trench sidewalls. The current leakage is especially noticeable at small channel widths, causing the threshold voltage to decrease as the channel width decreases. The boron implant creates doped regions 242 at the sidewall and bottom surfaces of trenches 224.

FIG. 3 illustrates subsequent processing Dielectric 234.2 has been formed in trenches 224, and the layers 102, 106 have been removed. Due to the boron diffusion, the doped regions 242 have spread into the active areas 230.

Then a gate line 410 (FIG. 4, top view) is formed to provide the transistor gates. The boron implant (FIG. 2) reduces the current leakage along the channel areas 420.

FIGS. 5-8 illustrate another substrate isolation process, described in K. Shibahara et al., "TRENCH ISOLATION WITH ∇(NABLA)-SHAPED BURIED OXIDE FOR 256-BIT DRAMS", IEDM 1992, pages 275-278, incorporated herein by reference. This process creates both LOCOS and STI isolation regions in the same substrate. LOCOS is used for wider isolation regions, and STI for narrower regions. LOCOS regions 510 are formed first. Then gate oxide 520, gate polysilicon 410, and cap oxide 530 are formed. Tapered trenches 224 (FIG. 6) are dry-etched with oxide 530 as a mask. Boron is vertically implanted into the trenches for suppression of sidewall inversion. Doped regions 242 are formed as a result. Reference numerals 230.1, 230.2, 230.3 denote the active areas.

The trenches are filled with silicon dioxide 234 (FIG. 7), and the structure is planarized. WSi layer 810 (FIG. 8) is sputtered on the structure. Layers 810, 410 are etched to form polyside gate electrodes.

Alternative substrate isolation techniques are desirable.

SUMMARY

This section summarizes some features of the invention. Other features are described in the subsequent sections. The invention is defined by the appended claims which are incorporated into this section by reference.

The isolation process of FIGS. 5-8 is attractive because it does not require the pad oxide 102 and the barrier layer 106 of FIG. 1. Also, the vertical boron implant (FIG. 6) is simpler than the angled implant (FIG. 2). However, the vertical implant relies on the tapered profile of STI trenches 224. The taper angle can be difficult to control, as explained in G. Fuse et al., "A New Isolation Method with Boron-Implanted Sidewalls for Controlling Narrow-Width Effect", IEEE Transactions on Electron Devices, vol. ED-34, No. 2, February 1987, pages 356-360, incorporated herein by reference. But if the vertical implant at the stage of FIG. 6 is replaced with an angled implant, the boron ions will hit the gate oxide 520 and may damage the oxide.

The inventors have discovered that the oxide damage may be annealed with subsequent thermal processing steps. In some embodiments, at least some of the anneal steps are performed after the gate oxide has been covered with other layers. Therefore, the anneal does not change the oxide profile.

Another aspect of the invention relates to the angled implant. In some embodiments, the angled implant is performed from the opposite sides of the wafer, and thus from the opposite sides of each active area. Each active area includes a region implanted from one side and a region implanted from the opposite side. According to this aspect of the invention, the two regions overlap to facilitate threshold voltage adjustment.

The invention is not limited to the features described above. For example, in some embodiments, the implant is performed from four sides of the wafer, or with a continuously rotating wafer, and the active area regions implanted from two opposite sides overlap with each other. Other features and advantages of the invention are described below. The invention is defined by the appended claims.

BRIEF DESCRIPTION OF THE DRAWINGS

FIGS. 9C, 9D, 9E show vertical cross sections of the integrated circuit of FIG. 9A.

FIGS. 10-12, 13A, 13B, 14A, 14B show vertical cross sections of intermediate structures obtained in the fabrication of the circuit of FIG. 9A.

FIG. 15A is a reference to another figure to represent an intermediate structure at a certain stage of the fabrication of the circuit of FIG. 9A.

FIGS. 15B, 16, 17A, 17B, 18-21 show vertical cross sections of intermediate structures obtained in the fabrication of the circuit of FIG. 9A.

FIG. 22 is a top view of a portion of the integrated circuit of FIG. 9A.

FIG. 23 shows a vertical cross section of an intermediate structure obtained in the fabrication of the circuit of FIG. 9A.

DESCRIPTION OF SOME EMBODIMENTS

The embodiments described in this section illustrate but do not limit the invention. The invention is not limited to particular materials, process steps, or dimensions. The invention is defined by the appended claims.

Figure 9B:
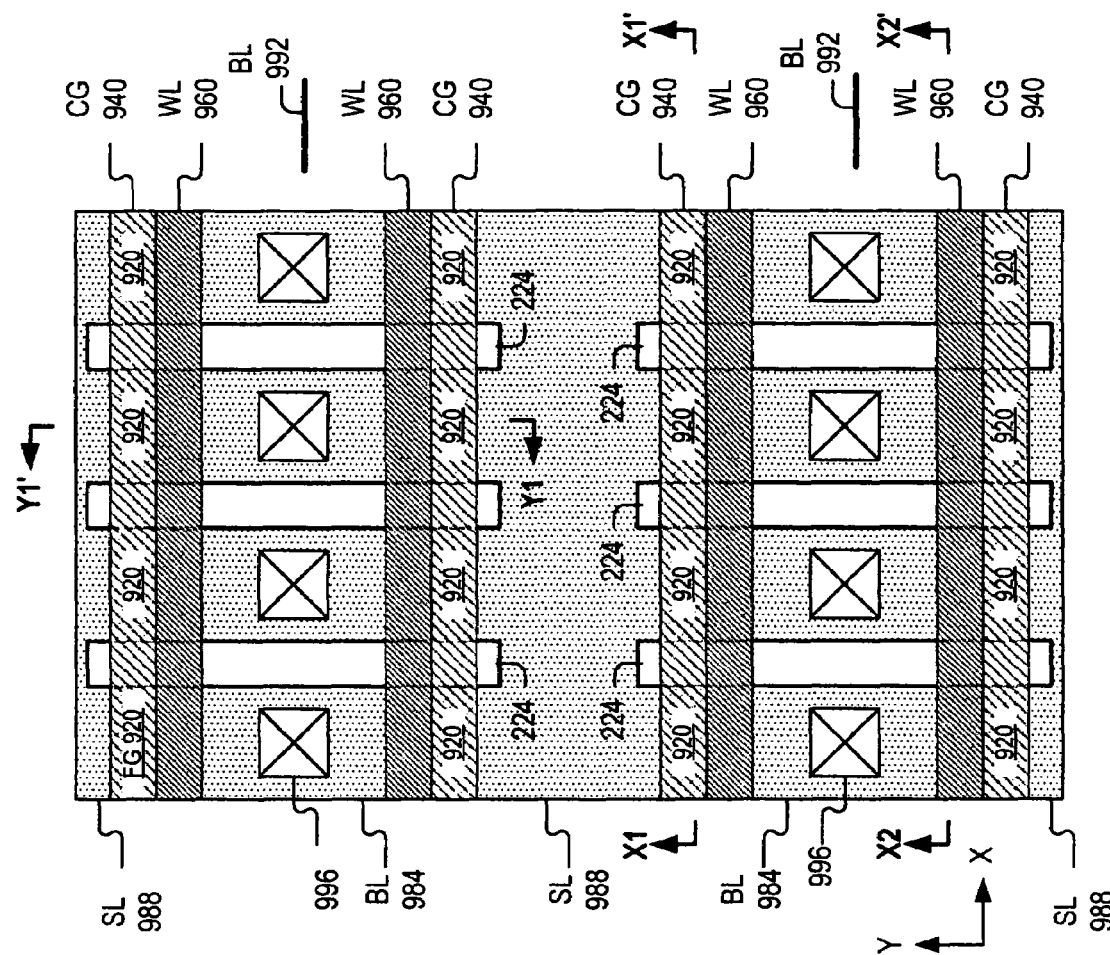
FIG. 9B is a top view of a portion of the integrated circuit of FIG. 9A.

One example of the invention will now be described with respect to a flash memory shown in FIGS. 9A (circuit diagram), 9B (top view), 9C (vertical cross section along the line Y1-Y1' in FIG. 9B), 9D (vertical cross section along the line X1 -X1' in FIG. 9B), and 9E (vertical cross section along the line X2-X2' in FIG. 9B).

The memory is fabricated in and over a P type well (doped P-) of a semiconductor substrate 120 (e.g. a monocrystalline silicon substrate). See FIGS. 9C, 9D, 9E. The well is isolated from the rest of the substrate by an N type region (not shown). Each memory cell 910 includes a conductive floating gate 920 (FIGS. 9B-9D) insulated from substrate 120 by dielectric 520. Control gate 940 overlies the floating gate. Control gate 940 is part of a conductive control gate line (e.g. polysilicon) that provides control gates for one row of the memory cells. The control gates are insulated from the underlying floating gates by dielectric 950. In each row, a conductive wordline 960 (FIGS. 9A-9C, 9E) provides the select gates for the memory cells. The wordline 960 is insulated from control gates 940 and floating gates 920 by silicon dioxide 964 (FIG. 9C) and dielectric spacers 968, and from substrate 120 by dielectric 980.

Each memory cell 910 has two N+ source/drain regions 984, 988 (FIGS. 9A-9C) in substrate 120. Region 988 ("source line" region), adjacent to floating gate 920, is part of an N+ source line. The source lines run in the row direction (X direction in FIG. 9B). Each source line 988 is shared by two adjacent rows.

Figure 9A:
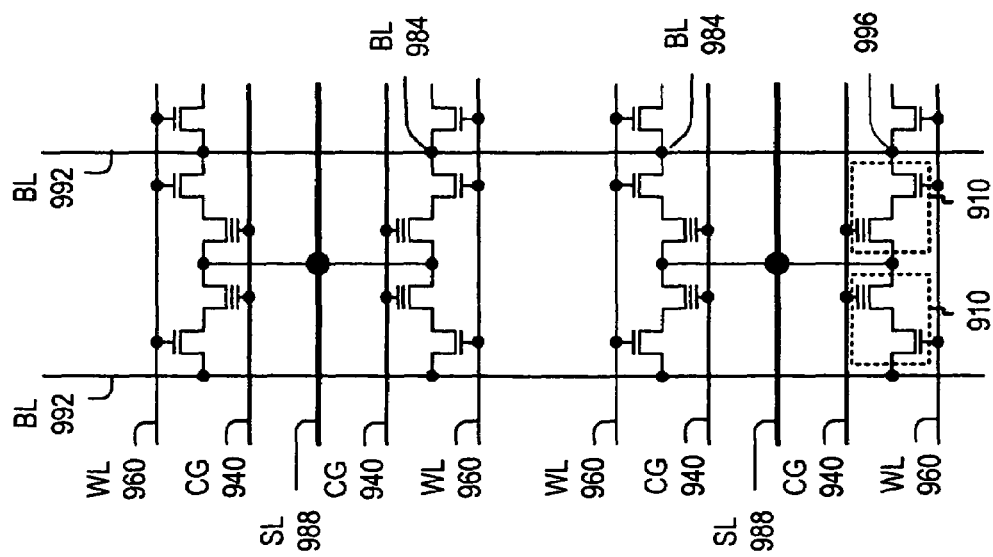
FIG. 9A is a circuit diagram of an integrated circuit fabricated according to one embodiment of the present invention.

In each column of the memory cells, "bitline regions" 984 are connected to a bitline 992 as shown FIG. 9A. Bitlines 992 are also shown schematically in FIG. 9B. The bitlines are formed from an overlying conductive layer. The contact openings to bitline regions 984 are shown at 996 in FIG. 9B.

Figure 1:
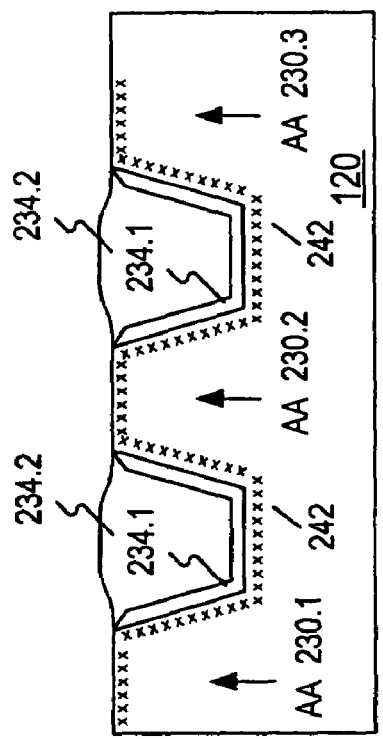
FIGS. 1-8 illustrate vertical cross sections of semiconductor structures in prior art integrated circuit fabrication processes.
Figure 2:
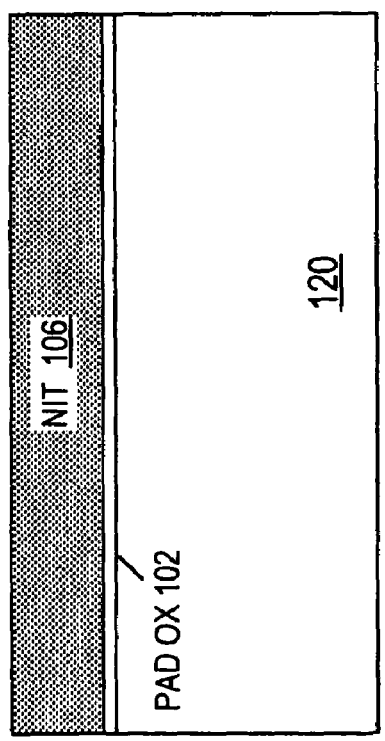
Figure 3:
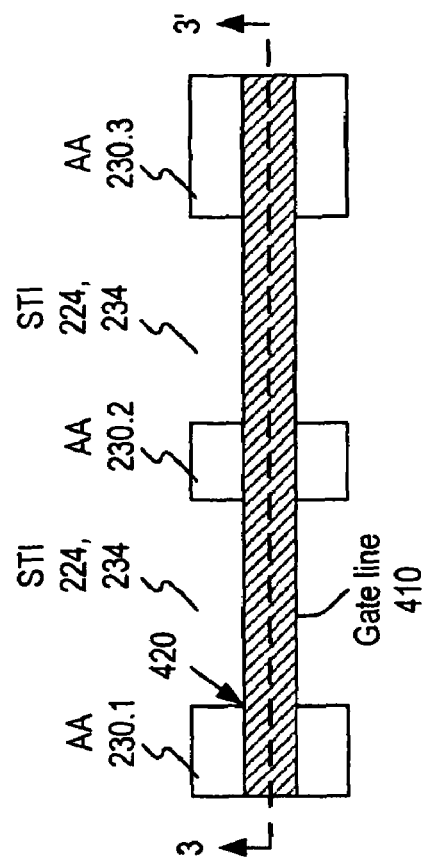
Figure 4:
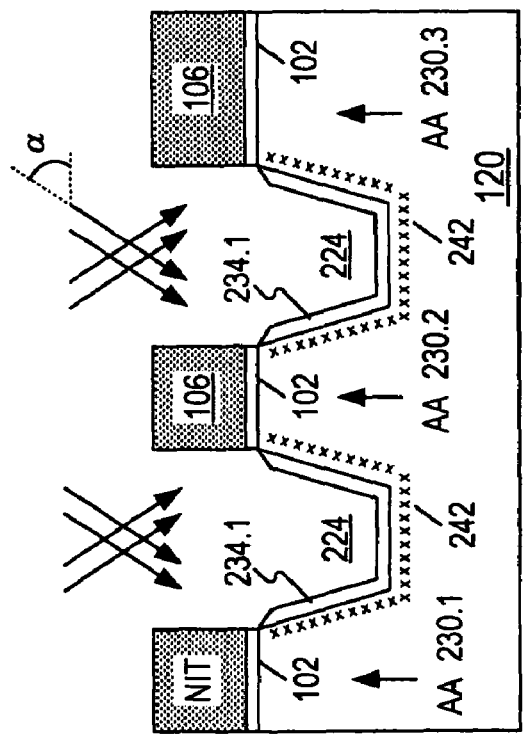
Figure 5:
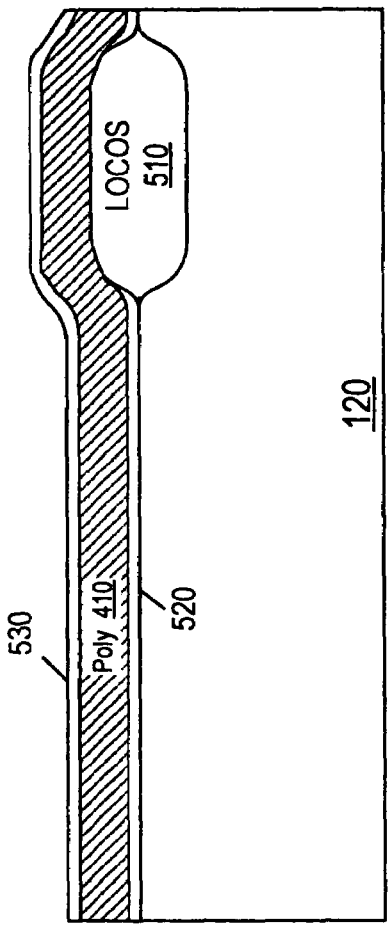
Figure 6:
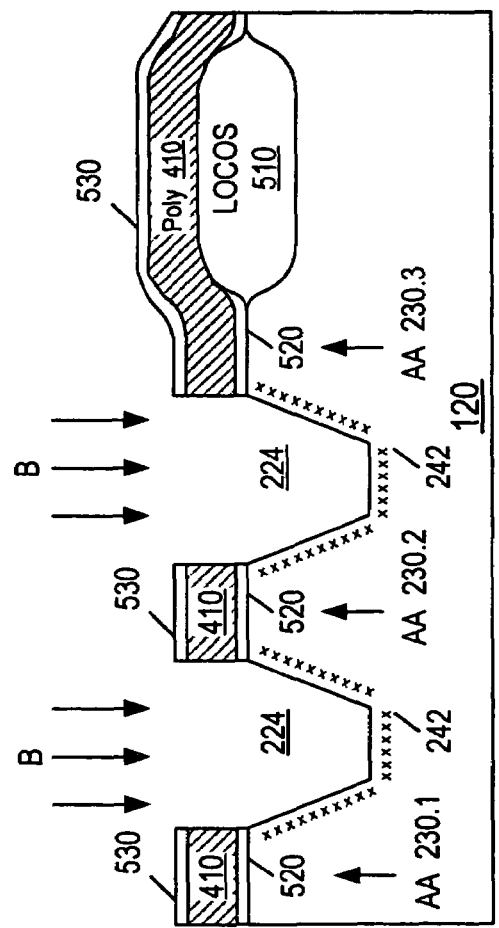
Figure 7:
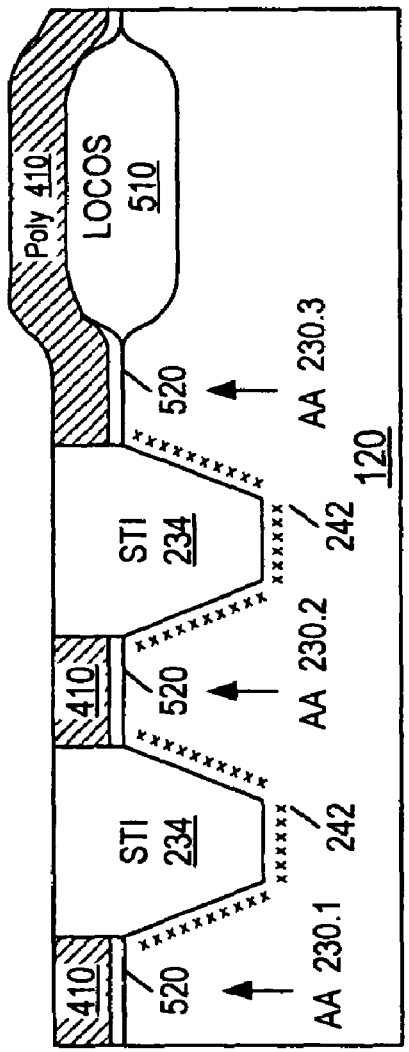
Figure 8:
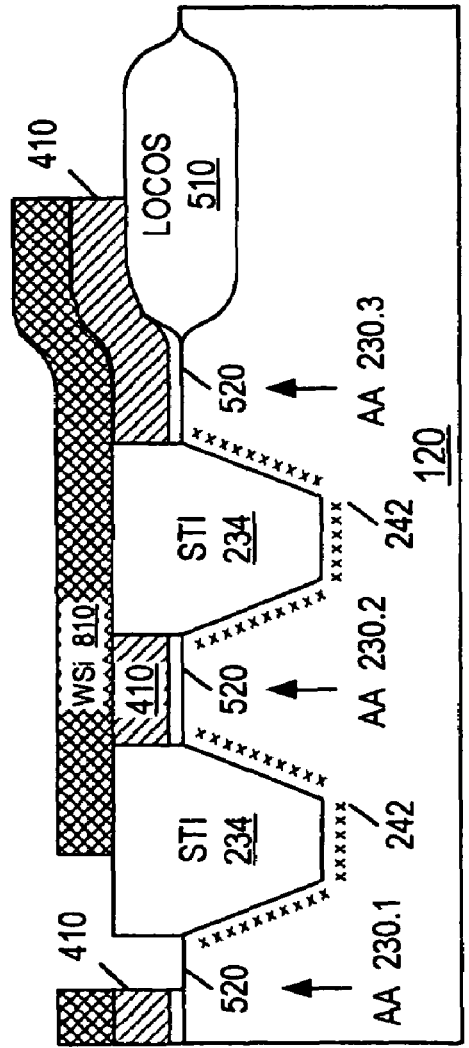

Isolation trenches 224 (FIGS. 9B, 9D, 9E) are formed in substrate 120 between adjacent columns of the memory cells by a shallow trench isolation process (STI). Each trench 224 extends across two memory rows between two respective source lines 988. The trench surface includes a boron implant area 242 formed by an angled implant as described below. The trench sidewalls can be either tapered or vertical. The trenches are filled with dielectric 234. The dielectric may consist of two layers 234.1, 234.2 as in FIG. 3, but this is not necessary. As shown in FIGS. 9D, 9E, the dielectric 234 totally fills the trenches and projects above the trenches. In other embodiments, the dielectric is limited to the trenches, and may or may not totally fill the trenches.

In FIG. 9A, each cell 910 is represented as a floating gate transistor and a select gate transistor connected in series. This diagram is not a precise representation of the memory because the channel regions of the floating gate transistor and the select transistor are merged together. (The channel region of the floating gate transistor is a P type region in substrate 120 under the floating gate 920. The channel region of the select transistor is a P type region in substrate 120 under select gate 960.) There is no N type region between the two channel regions. Other embodiments include an N type region between the two channel regions.

Each wordline 960 is formed as a spacer on a sidewall of a row structure 1010 (FIG. 9C) which includes dielectric 520, floating gates 920, dielectric 950, and control gate line 940 for the corresponding row of the memory cells. Row structure ("control gate structure") 1010 also includes a silicon nitride layer 1020 formed on top of control gate line 940 to control the size of the spacer 960. Nitride 1020 is not shown in FIG. 9B. Row structure 1010 includes silicon dioxide 964 and silicon nitride spacers 968 separating the control gate line 940 and the floating gates 920 from wordline 960. The wordline 960 overlies one sidewall in each row structure.

The cross section X1-X1' (FIGS. 9B, 9D) passes in the X direction (row direction) through a control gate line 940. Cross section X2-X2' (FIGS. 9B, 9E) passes in the X direction through a wordline 960. Cross section Y1-Y1' (FIGS. 9B, 9C) passes in the Y direction (column direction) through an active area of a memory cell.

In one embodiment, the memory is fabricated in a P doped wafer. The memory array P well is isolated in silicon substrate 120 by N type dopant implantation. A deep boron implant is performed into the P well. Then a threshold voltage (Vt) adjust boron implant of $4\times10^{12}$ atoms/cm$^2$ is performed at an energy of 10 KeV into peripheral NMOS high voltage transistor areas (shown in FIG. 13B at 1410). Other dopant implants are performed to form PMOS wells and to adjust threshold voltages of PMOS transistors. Pad layers may be formed on substrate 120 to screen the various implants. The pad layers are then removed.

As shown in FIG. 10, dielectric 520 ("tunnel oxide") is formed on substrate 120. FIG. 10 shows the cross sections X1-X1' and X2-X2' (the two cross sections are identical at this point). In one embodiment, dielectric 520 is a 9 nm thick layer of silicon dioxide formed by thermal oxidation. (The dimensions and materials are given for illustration and are not limiting.) Dielectric 520 is called "tunnel oxide" because electrons can be tunneled through oxide 520 to change the state of memory cell 110. A doped polysilicon layer 920 is deposited on oxide 520. The thickness of layer 920 is 100 nm to 200 nm. Silicon nitride 1040 is deposited on layer 920. Photoresist layer 1044 is formed over the wafer and photo-lithographically patterned to define isolation trenches 224 (FIGS. 9B and 11). Nitride 1040, polysilicon 920, oxide 520, and substrate 120 are etched through the resist openings to form the trenches (the resist can be removed after the etch of nitride 1040, and nitride 1040 can serve as a hard mask). FIG. 11 shows the cross sections X1-X1' and X2-X2'. The trenches are shown to have slightly tapered sidewalls, but the sidewalls can be vertical. In an exemplary embodiment, the sidewalls are tapered at an angle γ of about 77° to 87° relative to the horizontal line in the cross sectional view of FIG. 11.

Silicon dioxide 234.1 is a combination of two sub-layers. The first sub-layer is thermally grown on the surface of trenches 224 and the sidewalls of polysilicon 920 to passivate the silicon surfaces and round the trench corners. In one embodiment, this layer is grown by dry oxidation in an oven at 850° to a thickness of 50 Å to 100 Å. (All the temperatures herein are in degrees Celsius.) The oxidation is followed by an anneal at 850° for 15-30 minutes to density the oxide. The second sub-layer of layer 234.1 is a silicon dioxide layer deposited by HTO (high temperature oxidation) to an exemplary thickness of 50-100 Å.

An angled boron implant is performed through liner 234.1. The implant forms the doped regions 242 at the trench surface. In one embodiment, the implant angle β=25° relative to the line normal (orthogonal) to the wafer. Other angles in the range 0<β<90° can also be used. The exposed sidewall surfaces of tunnel oxide 520 face the stream of the boron ions. The ion stream forms the angle β with the oxide sidewalls. The oxide can be damaged by the implant. In one example, the implant energy is 40 KeV. The dose is $5 \times 10^{12}$ boron atoms/cm² per each trench side. The total dose is thus $5 \times 10^{14}$ for the four sides of the trenches.

Each active area includes a region implanted from the left side in the view of FIG. 11, and a region implanted from the right side. (Each of the left and right sides extends between a bitline region 984 and a source line 988.) The implantation from each side is performed at an angle δ relative to the trench sidewall facing that side. It can be shown that δ=β+90°−γ. Thus, if γ=90°, then δ=β. If γ is 77° to 87° and β=25°, then δ is 28° to 38°.

In each active area, the region implanted from the left side and the region implanted from the right side overlap with each other under the floating gate. The overlap width (measured left to right in FIG. 11) is shown as Ov. This overlap facilitates the use of this implant to be used as a Vt threshold adjust implant for the floating gate and select gate transistors. In one embodiment, the channel width Lw is 0.22-0.26 μm, and the overlap Ov is about 0.1 μm.

Isolation trenches 224 and dielectric 234.1 may also be formed in the periphery, and the angled implant may be performed with the periphery unmasked. The peripheral active area regions implanted from the opposite sides may or may not overlap with each other, depending on the channel width.

Boron dopant regions 242 will diffuse into the surrounding areas during the subsequent steps.

Trenches 224 are filled with a suitable dielectric 234.2 (FIG. 12, cross sections X1-X1' and X2-X2'). Dielectric 234.2 can be silicon dioxide formed by a high density plasma process. Oxide layers 234.1, 234.2 are subjected to chemical mechanical polishing (CMP) that stops on nitride 1040 (FIG. 11). The nitride is then removed, and layers 234.1, 234.2 are etched down to a level below the top surface of polysilicon 920 to increase the capacitive coupling between the floating and control gates. See U.S. Pat. No. 6,355,524 issued Mar. 12, 2002 to Tuan et al. and incorporated herein by reference. These processing particulars are exemplary and not limiting.

In the subsequent drawings and in FIGS. 9D and 9E, the dielectric layers 234.1, 234.2 are shown as layer 234.

Isolation regions 224, 234 and doped regions 242 are also formed in the peripheral areas (not shown) during these steps.

Dielectric 234 covers the tunnel oxide 520, so the sidewalls of oxide 520 adjacent to the trenches are not exposed during the subsequent fabrication steps. Advantageously, the bird's beak formation or other changes to the profile of oxide 520 are unlikely to occur adjacent to the trenches after the deposition of dielectric 234.2.

A boron implant of $5^{12}$ to $10^{13}$ atoms/cm² is performed at 50 to 100 KeV into the memory array to adjust the threshold voltages of the floating gate and select gate transistors. The implant goes through the polysilicon 920 and oxide 520 to reach the substrate 120, and the implant energy is chosen based on the thickness of polysilicon 920. Oxide 520 can be damaged during this step. The peripheral areas are masked with a photoresist (not shown) during this implant. The resist is then removed.

In an alternative embodiment, this boron implant is performed earlier, before the fabrication of oxide 520, through a sacrificial screen oxide layer (not shown), at a lower energy. The screen oxide is removed before the fabrication of oxide 520.

In some embodiments, the boron implant is omitted because the threshold voltage adjustment is performed by the implant of FIG. 11.

As shown FIG. 13A (cross sections X1-X1', X2-X2'), silicon dioxide 950A is deposited by HTO to an exemplary thickness of 2 nm to 10 nm. Silicon nitride 950B is deposited over the structure to a thickness of 5 to 15 nm by low pressure chemical vapor deposition (LPCVD).

The memory array is masked with photoresist (not shown), and the layers 950B, 950A, 920, 520 are removed from the peripheral area. See FIG. 13B showing a vertical cross section of an NMOS peripheral area. The NMOS area includes a high voltage (HV) transistor area 1410 and a low voltage (LV) transistor area 1420. The PMOS areas are similar (they are formed in N wells (not shown) in substrate 120). Substrate 120 becomes exposed in the peripheral active areas.

The resist is removed. Silicon dioxide 950C (FIG. 14A, cross sections X1-X1' and Y1-Y1', and FIG. 14B, periphery) is formed on substrate 120 and silicon nitride 950B as follows. First, 2 to 10 nm of silicon dioxide is deposited over the wafer by HTO. Then wet oxidation is performed in a 780° oven for 50-100 minutes to grow a 100-200 Å sublayer of silicon dioxide layer 950C on the peripheral active areas. (The HTO step and the wet oxidation step can be interchanged, with the wet oxidation performed first.) The HTO deposition and the wet oxidation are followed by a 30-60 minute anneal at 900°. Oxide 950C is then removed from the low voltage areas 1420 by a masked etch. The structure is oxidized again in a 850° oven in dry atmosphere for 10-30 minutes to re-grow oxide 950C in the low voltage areas 1420 to a thickness of 30-100 Å. The oxide thickness in high voltage areas 1410 increases to 130-300 Å during this step. This step is followed by a 30 minute anneal at 850°.

The two oxidation steps that form the oxide 950C, and the subsequent thermal anneal steps, anneal the oxide 520 to at least partially repair the damage from the boron implant of FIG. 11. Oxide 520 is not exposed, so its profile does not change.

In some of the subsequent figures and FIGS. 9C and 9D, the layers 950A, 950B, 950C in the array area are shown as ONO (oxide/nitride/oxide) layer 950.

Doped polysilicon 940 is deposited on the structure to an exemplary thickness of 80 nm. See FIGS. 9D, 15A, 15B. FIG. 15A simply points to FIG. 9D for a view of the X1-X1' cross section. FIG. 15B shows the cross section of a peripheral area.

Silicon nitride 1020 is deposited on polysilicon 940. An exemplary thickness of nitride 1020 is 160 nm.

A photoresist layer (not shown) is deposited and patterned to define the control gate lines 940. See FIG. 9A and FIG. 16 (cross section Y1-Y1'). Silicon nitride 1020 is removed where exposed by the resist. The photoresist can then be removed, with silicon nitride 1020 acting as a hard mask. Polysilicon 940 and oxide 950C are etched away in the areas not covered by nitride 1020. The periphery is protected by the resist during the etch of nitride 1020, so the periphery remains as in FIG. 15B.

A thin layer 1610 of silicon dioxide is grown on the sidewalls of polysilicon 940 to protect the polysilicon during the subsequent etch of nitride 950B. See U.S. Pat. No. 6,566,196 issued May 20, 2003 to Haselden et al. and incorporated herein by reference. In one embodiment, oxide 1610 is grown by dry oxidation in an 800° oven for 20 minutes to a thickness of 30 Å. The oxidation is followed by a 50 minute anneal at 800°. The oxidation and the anneal steps tend to further anneal the tunnel oxide 520. The periphery remains substantially unchanged (FIG. 15B).

Nitride 950B is removed in the areas not covered by nitride 1020 by an isotropic etch. The thickness of nitride 1020 is slightly reduced in this step in the array and peripheral areas.

Oxide 950A is removed in the areas not covered by nitride 1020. This step also removes the oxide 1610. The periphery remains unchanged.

Polysilicon 920 is etched anisotropically with nitride 1020 as a hard mask. Some of oxide 520 may be removed during this etch. The resulting structure is shown in FIGS. 17A (cross section Y1-Y1') and 17B (cross section X2-X2'). The periphery remains unchanged (FIG. 15B).

The exposed sidewalls of polysilicon layers 920, 940 are oxidized using dry oxidation in an 850° oven at for 15-30 minutes to grow a 50-100 Å thick silicon dioxide layer 964 (FIG. 18, cross section Y1-Y1'). The oxidation is followed by 15-30 minute anneal at 850°. Tunnel oxide 520 undergoes further anneal during these two step.

Silicon nitride layer 968 (FIG. 19, cross section Y1-Y1') is deposited conformally over the structure and etched anisotropically to form spacers on the sidewalls of structures 1010 described above in connection with FIG. 9C. The exposed portions of oxide 520 are etched away.

The peripheral area has a planar top surface, so the silicon nitride 968 is removed from the periphery during the nitride etch. The periphery remains as in FIG. 15B.

A sacrificial oxide layer 1910 (FIG. 19, cross section Y1-Y1') is grown on the exposed portions of substrate 120 as a screen oxide for a select gate transistor Vt adjust implant. In some embodiments, the oxide is grown by dry oxidation in an 850° oven for 10 minutes to a thickness of 30 Å. The oxidation is followed by a 15 minute anneal at 850°. Oxide 520 is further annealed during these steps.

Oxide 1910 is removed after the Vt adjust implant by a blanket oxide etch. As shown in FIG. 20 (cross section Y1-Y1'), gate dielectric 980 is formed on substrate 120 for the select transistors. In some embodiments, dielectric 980 is silicon dioxide grown in dry atmosphere in a 850° oven for 15-90 minutes to a thickness of 50-200 Å. The oxidation is followed by a 15-60 minute anneal at 850°. Tunnel oxide 520 undergoes further anneal during these steps. The periphery remains substantially as in FIG. 15B (although some oxide may form on nitride 1020).

Polysilicon 960 (FIG. 21, cross section Y1-Y1') is conformally deposited over the structure (by LPCVD for example), and is heavily doped during or after the deposition. In one embodiment, polysilicon 960 is about 300 nm thick.

Polysilicon 960 is subjected to an anisotropic, preferentially vertical etch (e.g. reactive ion etching, RIE) without a mask. The horizontal etch rate may or may not be zero, but it is less than the vertical etch rate. The etch forms spacers on the sidewalls of structures 1010. The etch stops on oxide 980 in the active areas of the array.

The periphery was planar before the polysilicon 960 deposition (see FIG. 15B), so polysilicon 960 is etched away in the periphery when the spacers are formed. The periphery remains as in FIG. 15B.

The peripheral transistor gates are formed by a masked etch of nitride 1020 and polysilicon 940 in the periphery. An exemplary top view of the peripheral area is shown in FIG. 22. Line 15B-15B' in FIG. 22 indicates the vertical cross section of FIG. 15B.

As shown in FIG. 23 (vertical cross section along the line 23-23' in FIG. 22), a silicon dioxide layer 2310 is thermally grown on the sidewalls of the peripheral transistor gates formed from polysilicon 940 to anneal the polysilicon etch damage and provide a pad layer between the polysilicon 940 and subsequently formed silicon nitride spacers (not shown) overlying the sidewalls of the peripheral transistor gates. In some embodiments, the oxide 2310 is grown by dry oxidation in an 850° oven for 10-30 minutes to a thickness of 30-100 Å. The oxidation is followed by a 15-30 minute anneal at 850°. Tunnel oxide 520 undergoes further anneal during these steps.

A photoresist mask (not shown) is formed over the memory array to protect the wordlines 960 (one spacer 960 for each structure 1010; see FIG. 9C). This mask covers the bitline regions 984 (which have not yet been doped). The unwanted spacers of polysilicon 960 (the spacers over source lines 988) are etched away. Source lines 988, bitlines 984, and the source/drain regions of the peripheral transistors are formed by suitable doping steps. The memory fabrication can be completed using known techniques. See e.g. U.S. Pat. No. 6,355,524 and U.S. patent application Ser. No. 10/402,698, both incorporated herein by reference.

The invention is not limited to the embodiments described above. The invention is not limited to the particular materials, process parameters or layer thicknesses. For example, the silicon oxidation steps do not have to be performed in an oven. RTO (rapid thermal oxidation) can be used instead for some or all of the oxidation steps. The invention is applicable to other memory and non-memory integrated circuits, including circuits without floating gate transistors. The invention is defined by the appended claims.

The invention claimed is:

1. A method for fabricating an integrated circuit comprising a conductive transistor gate formed over an active area of a semiconductor substrate, the active area having a first conductivity type, the method comprising:
   (a) forming one or more isolation trenches in the semiconductor substrate, the one or more trenches comprising a first sidewall surface on a first side of the active area and a second sidewall surface on a second side of the active area, the second side being opposite to the first side;
   (b) introducing a dopant of the first conductivity type into the active area through the first and second sidewall surfaces by an ion implantation, wherein the active area includes a first region implanted through the first sidewall surface and a second region implanted through the second sidewall surface, and the first and second regions overlap with each other.

2. The method of claim 1 wherein each of the first and second sides of the active areas extends between two source/drain regions.

3. The method of claim 2 wherein the active area comprises a transistor channel having a width of 0.22-0.26 μm, and an overlap of the first and second regions has a width of about 0.1 μm measured along the width of the transistor channel.

4. The method of claim 1 wherein the ion implantation is angled.

5. The method of claim 4 wherein the ion implantation comprises an angled ion implantation into the first sidewall surface at an angle to a line normal to the substrate, and an angled ion implantation into the second sidewall surface at an angle to a line normal to the substrate, wherein the ion implantation into the first sidewall surface and the ion implantation into the second sidewall surface are performed from opposite sides of the substrate.

6. The method of claim 4 wherein the ion implantation into the first sidewall surface is performed at an angle of 25° relative to a line normal to the substrate.

7. The method of claim 1 wherein the ion implantation into the first sidewall surface comprises an ion implantation at an angle of 28° to 38° relative to the first sidewall surface.

8. The method of claim 1 further comprising, before the operation (a), forming a first layer over the active area, wherein the conductive transistor gate comprises at least a portion of the first layer.

9. The method of claim 8 further comprising, before the operation (a), forming a gate dielectric over the active area for the conductive transistor gate.

10. The method of claim 1 further comprising:
   (i) forming a dielectric layer on the semiconductor substrate, wherein at least a portion of the dielectric layer on which the conductive transistor gate will be formed defines a gate dielectric;
   (ii) forming a first layer on the dielectric layer, wherein the conductive transistor gate comprises at least a portion of the first layer;
   (iii) forming a mask over the first layer to define the one or more isolation trenches;
   wherein the operation (a) comprises:
   (iv) patterning the first layer, the dielectric layer, and the semiconductor substrate to form a pattern defined by the mask, the patterning operation comprising:
      (iv-a) removing a portion of the first layer;
      (iv-b) removing a portion of the dielectric layer to form a dielectric layer sidewall, wherein the dielectric layer sidewall is part of the gate dielectric; and
      (iv-c) removing a portion of the semiconductor substrate to form the one or more isolation trenches;
   wherein the operation (b) comprises:
   (v) introducing the dopant of the first conductivity type into the first and second sidewall surfaces by the ion implantation of dopant ions, with the gate dielectric sidewall facing a stream of the dopant ions; and
   wherein the method further comprises:
   (vi) forming a dielectric over the first and second sidewall surfaces.

11. The method of claim 10 further comprising heating the gate dielectric in one or more thermal steps to anneal a damage to the gate dielectric caused by the ion implantation.

12. The method of claim 11 wherein at least one of the thermal steps is performed with the gate dielectric sidewall not being exposed.

13. The method of claim 11 wherein at least one of the thermal steps is performed when the dielectric formed over the first and second sidewall surfaces in operation (vi) covers the gate dielectric sidewall.

14. The method of claim 11 wherein at least one of the thermal steps is performed with the gate dielectric not being exposed.

15. The method of claim 11 wherein the gate dielectric comprises silicon oxide.

16. The method of claim 15 wherein at least one of the thermal steps comprises holding a semiconductor structure comprising the gate dielectric at a temperature of at least 750° C. for at least 15 minutes.

17. The method of claim 11 wherein at least one of the thermal steps comprises an oxidation step.

18. The method of claim 17 wherein the oxidation step comprises growing silicon dioxide.

19. The method of claim 10 wherein the ion stream forms an angle of 25° relative to a line normal to the semiconductor substrate.

20. The method of claim 10 wherein the conductive transistor gate is a floating gate of a non-volatile memory cell.

21. The method of claim 20 wherein the gate dielectric is a tunneling dielectric through which a charge is tunneled to change a state of the memory cell.

22. The method of claim 10 wherein the first conductivity type is type P.

23. The method of claim 22 wherein the dopant comprises boron.

* * * * *